United States Patent
Okayama et al.

(10) Patent No.: US 6,485,604 B1
(45) Date of Patent: Nov. 26, 2002

(54) SUBSTRATE PROCESSING APPARATUS

(75) Inventors: Satohiro Okayama, Tokyo (JP); Kenji Etoh, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/391,062

(22) Filed: Sep. 7, 1999

(30) Foreign Application Priority Data

Sep. 7, 1998 (JP) .............................. 10-268969

(51) Int. Cl.$^7$ .............................. C23C 16/00; C23F 1/02
(52) U.S. Cl. .............................. 156/345.47; 118/723 E
(58) Field of Search ........................ 118/723 E, 723 ER, 118/723 I, 723 IR, 723 AN; 156/345

(56) References Cited

U.S. PATENT DOCUMENTS

| | | | | |
|---|---|---|---|---|
| 5,772,770 A | * | 6/1998 | Suda et al. ................. | 118/719 |
| 5,772,833 A | * | 6/1998 | Inazawa et al. ........... | 156/345 P |

FOREIGN PATENT DOCUMENTS

| JP | 63-186419 | 8/1988 |
|---|---|---|
| JP | 03-203317 | 9/1991 |
| JP | 04003927 | 1/1992 |
| JP | 05003176 | 1/1993 |
| JP | 05125545 | 5/1993 |
| JP | 05-160035 | 6/1993 |
| JP | 10144498 | 5/1998 |
| JP | 11031661 | 2/1999 |

OTHER PUBLICATIONS

Notification of Reason(s) for Refusal; Jul. 27, 1999.

* cited by examiner

Primary Examiner—Gregory Mills
Assistant Examiner—Luz Alejandro
(74) Attorney, Agent, or Firm—Hogan & Harston, LLP (57) ABSTRACT

A substrate processing apparatus that includes an outer tank, an inner tank, and opposed electrodes. The inner tank is provided in the outer tank and the opposed electrodes are provided in the inner tank. A distance between the opposed electrodes can be changed in a state in which the inner tank can completely confine plasma therein. The inner tank includes first and second inner tank constituent members, and the state in which the inner tank can completely confine plasma therein is established by superposing a side wall of the second inner tank constituent member on a side wall of the first inner tank constituent member.

20 Claims, 6 Drawing Sheets

SUBSTRATE PROCESSING APPARATUS

BACKGROUND OF THE INVENTION

1. Field of the Invention

The present invention relates to a substrate processing apparatus and a substrate processing method, and more particularly, to a plasma-enhanced film forming apparatus and a plasma-enhanced film forming processing method.

2. Description of the Related Art

Figure 6:
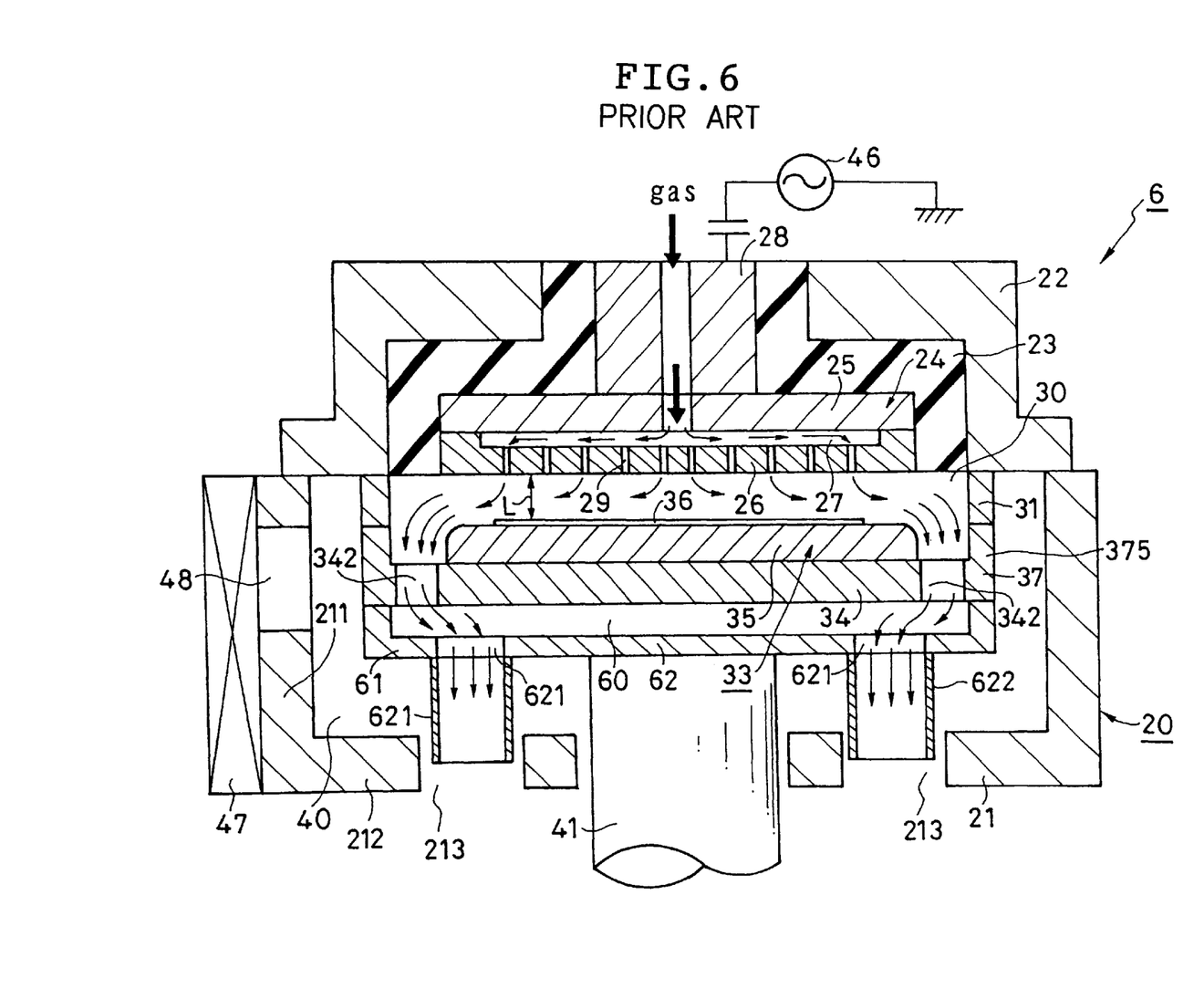
FIG. 6 is a longitudinal sectional view for explaining a conventional plasma processing apparatus.

As such a plasma-enhanced CVD (chemical Vapor Deposition) film forming apparatus, one having a structure as shown in FIG. 6 has been proposed.

This conventional plasma-enhanced CVD apparatus 6 is an inner tank closed type plasma-enhanced CVD apparatus in which a closed inner tank 30 is formed in an outer tank 20.

In this plasma-enhanced CVD apparatus 6, a lower inner tank wall 37 is mounted around an anode plate 34 which constitutes a lower electrode (anode) 33 together with a susceptor 35. The lower inner tank wall 37 is lifted together with the anode plate 34 so that a side wall 375 of the lower inner tank wall 37 abuts against an upper inner tank side wall 31, thereby forming the closed inner tank 30. Therefore, when the closed inner tank 30 is formed, the position of the anode 33 is determined uniquely, and a distance L between an upper electrode (cathode) 24 and the lower electrode (anode) 33 is determined uniquely.

As today's working method of a plasma-enhanced CVD apparatus, especially in a plasma-enhanced CVD apparatus for LCD (Liquid Crystal Display), it is general to carry out an online gas cleaning process. That is, it is necessary to carry out two different kinds of processes such as a CVD process and a gas cleaning process with the same electrodes.

In the case of the CVD apparatus, it is required that the processing speed of both CVD process and gas cleaning process is enhanced. Although the distance between the electrodes is one of important factors to determine the processing speed, there is almost no case in which the distance between the electrodes suitable for CVD process is the same as that suitable for gas cleaning process and in generally, an optimal distance between electrodes for CVD process is different from that for gas cleaning process. Further, in the case of CVD process also, an optimal distance between the electrodes differs depending upon the kinds of film.

However, in the conventional CVD apparatus, there are drawbacks that it is impossible to change the distance between the electrodes while keeping the closed structure, and if the distance between the electrodes which is suitable for one of the processes, the other process must be carried out inefficiently.

Furthermore, if distances between the electrodes which are respectively optimal for the two processes, during either one of the processes, it is impossible to keep the closed structure. For this reason, there are problems that plasma is spread out in the outer tank 20, the plasma density is lowered and as a result, the processing speed is decreased. Further, since gas leaks into the outer tank 20, there is a problem that the outer tank 20 is contaminated.

SUMMARY OF THE INVENTION

According to a first aspect of the present invention, there is provided a substrate processing apparatus, including:

an outer tank, an inner tank provided in the outer tank, and opposed electrodes provided in the inner tank, wherein a distance between the opposed electrodes can be changed in a state in which the inner tank can completely confine plasma therein, and the inner tank includes first and second inner tank constituent members, and the state in which the inner tank can completely confine plasma therein is established by superposing a side wall of the second inner tank constituent member on a side wall of the first inner tank constituent member.

According to a second aspect of the present invention, there is provided a substrate processing apparatus, including:

an outer tank, an inner tank provided in the outer tank, and opposed electrodes provided in the inner tank, wherein the inner tank can completely confine plasma therein with respect to two or more different distances between the opposed electrodes, and the inner tank includes first and second inner tank constituent members, and the state in which the inner tank can completely confine plasma therein is established by superposing a side wall of the second inner tank constituent member on a side wall of the first inner tank constituent member.

According to a third aspect of the present invention, there is provided a substrate processing apparatus, including:

an outer tank, an inner tank provided in the outer tank, and opposed electrodes provided in the inner tank, wherein a distance between the opposed electrodes can be changed in a state in which the inner tank is closed, and the inner tank includes first and second inner constituent members, and the inner tank is closed by superposing a side wall of the second inner tank constituent member on a side wall of the first inner tank constituent member, at least one of the side wall of the first inner tank constituent member and the side wall of the second inner tank constituent member includes a plurality of auxiliary side walls, and the plurality of auxiliary side walls of one of the side wall of the first inner tank constituent member and the side wall of the second inner tank constituent member, and the side wall of the other of the first inner tank constituent member and the side wall of the second inner tank constituent member are superposed on each other, thereby closing the inner tank.

According to a fourth aspect of the present invention, there is provided a substrate processing apparatus, including:

an outer tank, an inner tank provided in the outer tank, and opposed electrodes provided in the inner tank, wherein the inner tank can be closed with respect to two or more different distances between the opposed electrodes, and the inner tank includes first and second inner constituent members, and the inner tank is closed by superposing a side wall of the second inner tank constituent member on a side wall of the first inner tank constituent member, at least one of the side wall of the first inner tank constituent member and the side wall of the second inner tank constituent member includes a plurality of auxiliary side walls, and the plurality of auxiliary side walls of one of the side wall of the first inner tank constituent member and the side wall of the second inner tank constituent member, and the side wall of the other of the first inner tank constituent member and the side wall of the second inner tank constituent member are superposed on each other, thereby closing the inner tank.

According to a fifth aspect of the present invention, there is provided a substrate processing apparatus, including:

an outer tank, an inner tank provided in the outer tank, and opposed electrodes provided in the inner tank, wherein a distance between the opposed electrodes can be changed in a state in which the inner tank can confine plasma therein, the inner tank includes first and second inner tank constituent members, the state in which the inner tank can confine plasma therein is established by bringing the second inner tank constituent member into contact with the first inner tank constituent member, the opposed electrodes include first and second electrodes which are opposed to each other, the first electrode is disposed closer to the first inner tank constituent member, the second electrode is disposed closer to the second inner tank constituent member, the second electrode can move in a state in which the second inner tank constituent member is in contact with the first inner tank constituent member, the substrate processing apparatus further includes a further inner tank constituent member coupled to the second electrode, and a further inner tank can be formed in the inner tank by bringing the further inner tank constituent member into abutment against the first inner tank constituent member.

According to a sixth aspect of the present invention, there is provided a substrate processing apparatus, including:

an outer tank, an inner tank provided in the outer tank, and opposed electrodes provided in the inner tank, wherein the inner tank can confine plasma therein with respect to two or more different distances between the opposed electrodes, the inner tank includes first and second inner tank constituent members, the state in which the inner tank can confine plasma therein is established by bringing the second inner tank constituent member into contact with the first inner tank constituent member, the opposed electrodes include first and second electrodes which are opposed to each other, the first electrode is disposed closer to the first inner tank constituent member, the second electrode is disposed closer to the second inner tank constituent member, the second inner tank constituent member can contact the first inner tank constituent member with respect to two or more different distances between the opposed electrodes, the substrate processing apparatus further includes a further inner tank constituent member coupled to the second electrode, and a further inner tank can be formed in the inner tank by bringing the further inner tank constituent member into abutment against the first inner tank constituent member.

According to a seventh aspect of the present invention, there is provided a substrate processing apparatus including:

an outer tank, an inner tank provided in the outer tank, and opposed electrodes provided in the inner tank, wherein a distance between the opposed electrodes can be changed in a state in which the inner tank is closed, and the inner tank includes first and second inner tank constituent members, and the state in which the inner tank is closed is established by superposing a side wall of the second inner tank constituent member on a side wall of the first inner tank constituent member.

According to an eighth aspect of the present invention, there is provided a substrate processing apparatus including:

an outer tank, an inner tank provided in the outer tank, and opposed electrodes provided in the inner tank, wherein the inner tank can be closed with respect to two or more different distances between the opposed electrodes, and the inner tank includes first and second inner tank constituent members, and the state in which the inner tank is closed is established by superposing a side wall of the second inner tank constituent member on a side wall of the first inner tank constituent member.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS (First Embodiment)

Figure 1:
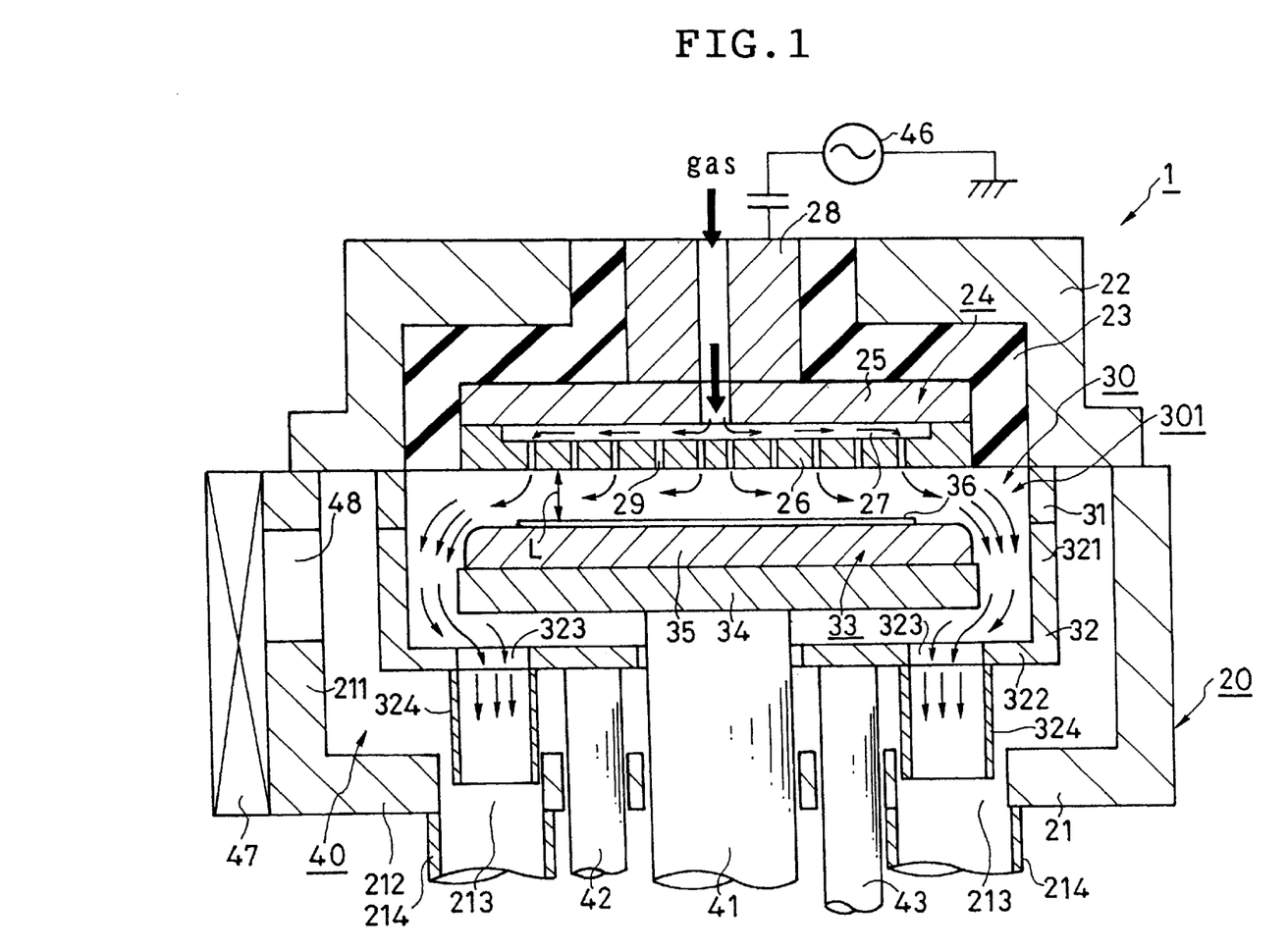
FIG. 1 is a longitudinal sectional view for explaining a plasma processing apparatus and a plasma processing method according to a first embodiment of the present invention.

Referring to FIG. 1, a plasma-enhanced CVD apparatus 1 of the first embodiment is of a two-tank structure comprising an outer tank (vacuum container) 20 and an inner tank 30.

The outer tank 20 includes an outer tank body 21 and a ceiling lid 22. The ceiling lid 22 has convex cross section. A recess is formed in the central portion of the ceiling lid 22, and an upper electrode (cathode) 24 is provided in the recess through an insulator 23.

The cathode 24 includes a cathode plate 25, a shower plate 26 and a reaction gas introducing tube 28. A hollow portion 27 is formed between the cathode plate 25 and the shower plate 26. The hollow portion 27 is in communication with a reaction gas introducing tube 28. A large number of gas dispersion holes 29 are formed in the shower plate 26 so that reaction gas introduced from the reaction gas introducing tube 28 is dispersed and supplied into the inner tank 30 from the gas dispersion holes 29 and as a result, the reaction gas is uniformly supplied onto a substrate 36 (a glass substrate for a liquid crystal display element in the present embodiment) placed on a susceptor 35.

The outer tank body 21 is provided at its bottom plate 212 with outer discharge ports 213, and an outer discharge tubes 214 which are in communication with the outer discharge ports 213 are mounted to the bottom plate 212. The outer tank body 21 is provided at its side plate 211 with a substrate IN/OUT opening 48, and a gate valve 47 is mounted to the substrate IN/OUT opening 48.

An upper inner tank side wall 31 surrounding the insulator 23 is fixed to a lower surface of a periphery of the ceiling lid 22.

An inner tank body 32 is provided in the outer tank body 21. A lower inner tank side wall 321 which is a side wall of the inner tank body 32 is provided in correspondence with the upper inner tank side wall 31. A bottom plate 322 of the inner tank body 32 is fixed to upper ends of inner tank driving shafts 42 and 43. The bottom plate 322 is lifted and lowered by lifting and lowering the inner tank driving shafts 42 and 43, and if the inner tank driving shafts 42 and 43 are lifted, the lower inner tank side wall 321 is also lifted and abutted against the upper inner tank side wall 31. The cathode 24, the insulator 23, the upper inner tank side wall 31 and the inner tank body 32 constitute the inner tank 30, and an inner tank space 301 is formed in the inner tank 30. The inner tank driving shafts 42 and 43 are provided such as to pass through the bottom plate 212 of the outer tank body 21 airtightly and vertically movably.

The bottom plate 322 of the inner tank body 32 is formed with inner discharge ports 323, and inner discharge tubes 324 which are in communication with the inner discharge ports 323 are mounted the bottom plate 322. Each of the inner discharge tubes 324 is inserted into the outer discharge port 213 and the outer discharge tube 214. An outer tank space 40 is defined by the outer tank body 21, the ceiling lid 22, the upper inner tank side wall 31, the inner tank body 32, a lower electrode driving shaft 41, the inner tank driving shafts 42, 43 and the inner discharge tubes 324.

A lower electrode (anode) 33 is provided in the inner tank 30 such as to be opposed to the cathode 24. The anode 33 includes an anode plate 34 and a susceptor 35 provided on the anode plate 34. A resistance heating type heater wire (not shown) is embedded in the anode plate 34. The cathode 24 and the anode 33 constitute a so-called parallel plate type electrode. An RF power supply 46 is connected to the cathode 24, the anode 33 is grounded, and an RF power can be applied between the cathode 24 and the anode 33.

The anode plate 34 is fixed on an upper end of the lower electrode driving shaft 41, and is lifted and lowered by lifting and lowering the lower electrode driving shaft 41. The lower electrode driving shaft 41 is provided such as to pass through the bottom plate 212 of the outer tank body 21 airtightly and vertically movably. Since the lower electrode driving shaft 41 can be driven independently from the inner tank driving shafts 42 and 43, in a state in which the lower inner tank side wall 321 is lifted and abutted against the upper inner side wall 31 to close the inner tank 30, when the anode 33 is lifted or lowered by the lower electrode driving shaft 41, a distance between an upper surface of the susceptor 35 and a lower surface of the shower plate 26, i.e., a distance L between the electrodes can be set arbitrarily.

When a film is formed or gas etching is carried out, gas in the inner tank 30 is discharged through the outer discharge tubes 214, the inner discharge tubes 324 and the inner discharge port 323, and gas in the outer tank space 40 is discharged through the outer discharge tubes 214. While evacuating the inner tank 30 and the outer tank space 40 in this manner, reaction gas for forming a film or reaction gas for gas etching is introduced from the reaction gas introducing tube 28 into the inner tank 30 to respectively control pressure values of the inner tank 30 and the outer tank space 40 to be predetermined ones.

Next, operation of the plasma-enhanced CVD apparatus 1 having the above-described structure will be explained.

When a substrate 36 is transferred in, the inner tank driving shafts 42 and 43 are driven, and the inner tank body 32 is lowered to open the inner tank 30. The lower electrode driving shaft 41 is driven to lower the anode 33. The outer tank (vacuum container) 20 is evacuated into a predetermined vacuum through the outer discharge tubes 214.

The gate valve 47 is opened, the substrate 36 is transferred into the outer tank (vacuum container) 20 from the substrate IN/OUT opening 48 by a transfer device (not shown), and the substrate 36 is placed on the susceptor 35. After the transfer device is retreated out of the outer tank (vacuum container) 20, the gate valve 47 is closed. Then, the anode 33 is lifted by the lower electrode driving shaft 41, the distance between the upper surface of the susceptor 35 and the lower surface of the shower plate 26, i.e., the distance L between the electrodes is set to a value suitable for plasma-enhanced CVD, the inner tank body 32 is lifted by the inner tank driving shafts 42 and 43, and the lower inner tank side wall 321 is abutted against the upper inner tank side wall 31 to close the inner tank 30.

Thereafter, reaction gas for forming a film is introduced from the reaction gas introducing tube 28 into the inner tank 30 while evacuating the inner tank 30 and the outer tank space 40 to respectively control pressure values of the inner tank 30 and the outer tank space 40 to be the predetermined ones, and an RF power is applied between the cathode 24 and the anode 33 by the RF power source 46 to generate plasma while heating by the resistance heating type heater wire (not shown) embedded in the anode plate 34, thereby forming a film on the substrate 36 by the plasma-enhanced CVD method. At the time of film formation, reaction gas and reaction by-product are discharged through the inner discharge ports 323, the inner discharge tubes 324 and the outer discharge tubes 214.

When the film formation is completed, supply of reaction gas is stopped, the inner tank 30 and the outer tank space 40 are evacuated through the inner discharge tubes 324, the outer discharge tubes 214 and the like.

Thereafter, the inner tank body 32 is lowered, the anode 33 is also lowered and then, the gate valve 47 is opened, and the substrate 36 is transferred out from the substrate IN/OUT opening 48 by the transfer device (not shown).

Then, another substrate 36 is transferred in from the substrate IN/OUT opening 48 by the transfer device (not shown), and film forming process onto the substrate 36 is carried out. After the film forming processes onto the substrate 36 in this manner are carried out predetermined times, gas cleaning is carried out.

To carry out the gas cleaning, the anode 33 is lifted by the lower electrode driving shaft 41 in a state in which the substrate 36 is not placed on the susceptor 35, the distance between the upper surface of the susceptor 35 and the lower surface of the shower plate 26, i.e., the distance L between the electrodes is set to a value suitable for the gas cleaning. The distance L between the electrodes suitable for the gas cleaning is set to be greater than that suitable for the plasma-enhanced CVD film formation. The inner tank body is lifted by the inner tank driving shafts 42 and 43, and the lower inner tank side wall 321 is abutted against the upper inner tank side wall 31 to close the inner tank 30.

Thereafter, reaction gas for the gas cleaning is introduced from the reaction gas introducing tube 28 into the inner tank 30 while evacuating the inner tank 30 and the outer tank space 40 to respectively control pressure values of the inner tank 30 and the outer tank space 40 to be the predetermined ones, and an RF power is applied between the cathode 24 and the anode 33 to generate plasma, thereby removing reaction by-product adhered to or accumulated on an inner wall of the inner tank 30 by etching. At the time of gas cleaning, residue generated during the cleaning is discharged through the inner discharge ports 323, the inner discharge tubes 324 and the outer discharge tubes 214.

When the gas cleaning is completed, supply of cleaning gas is stopped, the inner tank 30 and the outer tank space 40 are evacuated through the inner discharge tubes 324, the outer discharge tubes 214 and the like.

Thereafter, the film forming process onto the substrate 36 is again carried out as in the above-described manner.

As described above, in the present embodiment, since the distance L between the electrodes can be changed into values respectively suitable for the plasma-enhanced CVD film formation and the gas cleaning, it is possible to enhance the processing efficiency of both the plasma-enhanced CVD film formation and the gas cleaning.

Further, since both the plasma-enhanced CVD film formation and the gas cleaning are carried out in a state in which the lower inner tank side wall 321 is abutted against the upper inner tank side wall 31 and the inner tank 30 is closed, it is possible to limit the place where plasma is generated during the film formation or the gas cleaning only to the inside of the inner tank 30. As a result, it is possible to increase plasma density, and to carry out the film formation or the gas etching efficiently. Further, since gas and the like for the film formation and the gas etching process do not leak to the outer tank space 40, it is possible to prevent the inside of the outer tank 20 from being contaminated.

(Second Embodiment)

Figure 2:
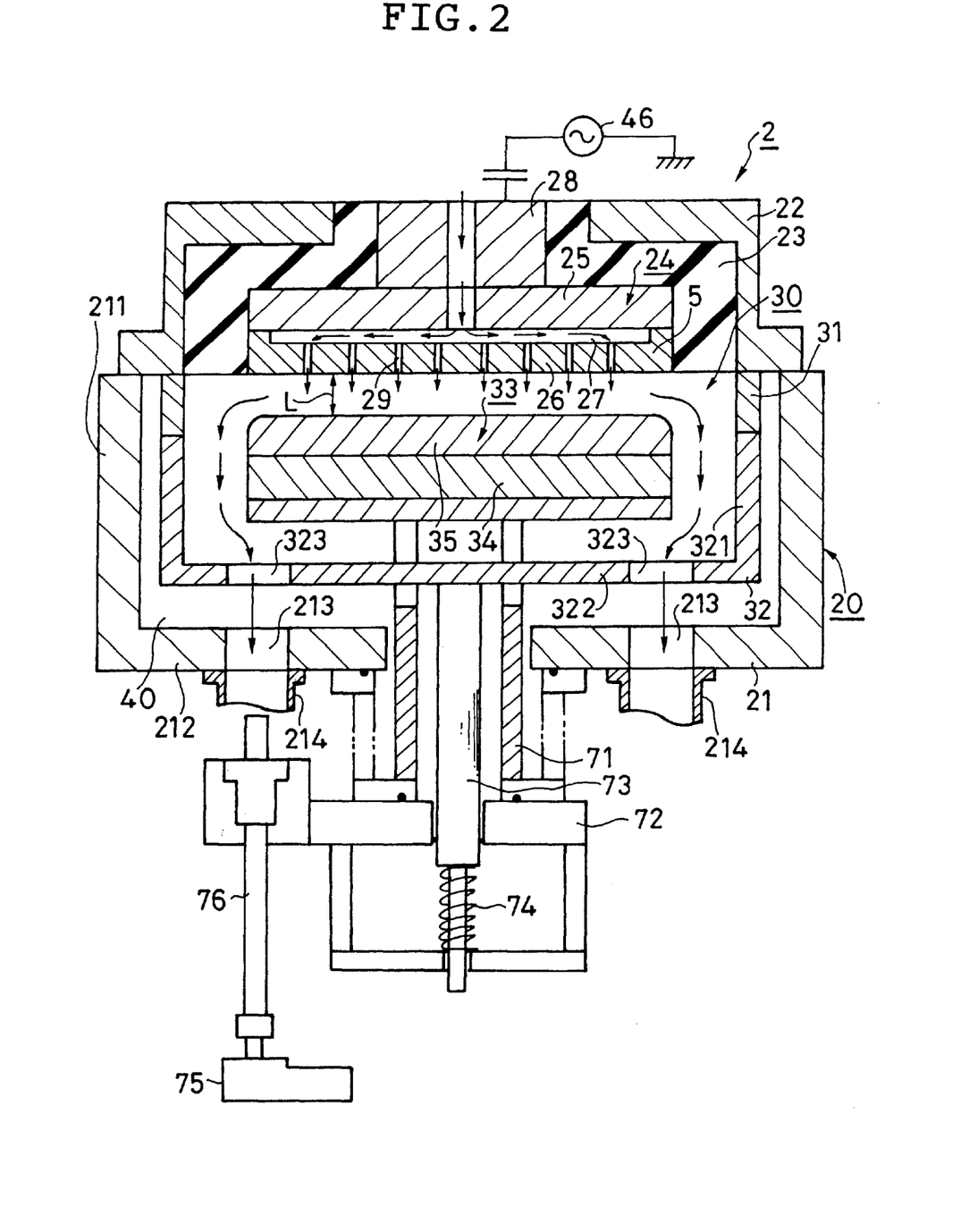
FIG. 2 is a longitudinal sectional view for explaining a plasma processing apparatus and a plasma processing method according to a second embodiment of the present invention.

Referring to FIG. 2, a bottom plate 322 of an inner tank body 32 is fixed to an upper end of an inner tank driving shaft 73. The inner tank driving shaft 73 sits on a base 72 by a spring 74. A lower electrode driving shaft 71 is fixed to the base 72, and a lower electrode (anode) 33 is fixed on the lower electrode driving shaft 71. By driving an AC motor 75, the base 72 is vertically moved through a ball screw 76 and simultaneously, the lower electrode driving shaft 71 and the inner tank driving shaft 73 are vertically moved together. If the base 72 is lifted, the lower electrode driving shaft 71 and the inner tank driving shaft 73 are lifted, and the lower inner tank side wall 321 is also lifted and abutted against the upper inner tank side wall 31. If the base 72 is further lifted, the spring 74 is compressed, and only the lower electrode (anode) 33 is lifted. Other structure is the same as that of the first embodiment, and the operating manner is also the same.

According to the second embodiment, it is possible to arbitrarily set the distance L between the electrodes in a state in which the lower inner tank side wall 321 abuts against the upper inner tank side wall 31 by the spring force to keep the closed inner tank structure.

(Third Embodiment)

Figure 3:
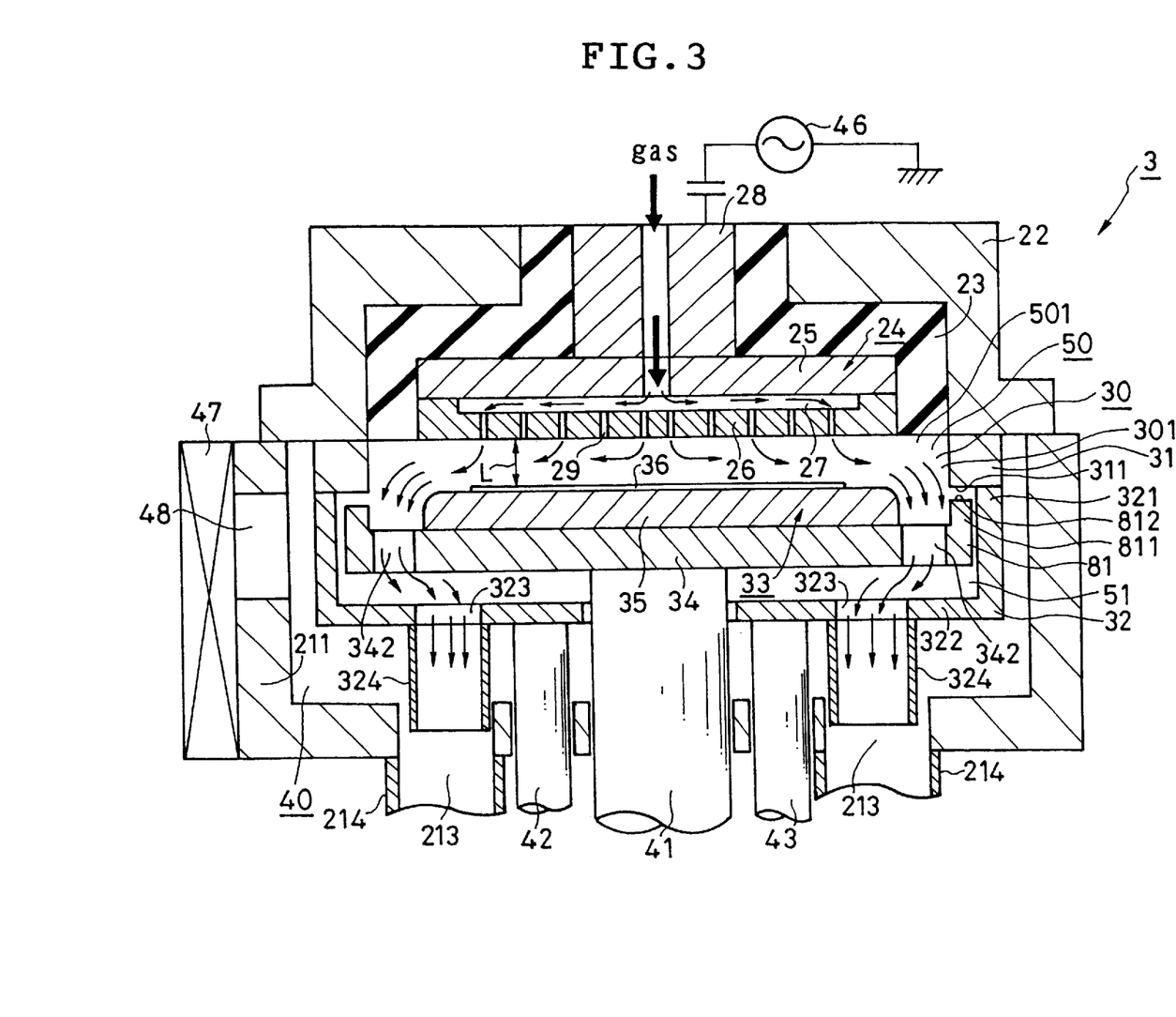
FIG. 3 is a longitudinal sectional view for explaining a plasma processing apparatus and a plasma processing method according to a third embodiment of the present invention.

Referring to FIG. 3, in the third embodiment, an upper inner tank side wall 31 surrounding an insulator 23 is fixed to a lower surface of a periphery of a ceiling lid 22. This upper inner tank side wall 31 is wider in width than that of the first embodiment.

An inner tank body 32 is provided in an outer tank body 21. A lower inner tank side wall 321 which is a side wall of the inner tank body 32 is provided in correspondence with an outer side of the upper inner tank side wall 31. A bottom plate 322 of the inner tank body 32 is fixed to upper ends of inner tank driving shafts 42 and 43, and are vertically moved by vertically moving the inner tank driving shafts 42 and 43, and when the inner tank driving shafts 42 and 43 are lifted, the lower inner tank side wall 321 is also lifted and abutted against the upper inner tank side wall 31. A cathode 24, an insulator 23, the upper inner tank side wall 31 and the inner tank body 32 constitute an inner tank 30, and an inner tank space 301 is defined in the inner tank 30.

A lower electrode (anode) 33 is provided in the inner tank 30 such as to be opposed to the cathode 24. The anode 33 includes an anode plate 34 and a susceptor 35 provided on the anode plate 34. A resistance heating type heater wire (not shown) is embedded in the anode plate 34.

A lower farther inner tank wall 81 is fixed around a periphery of the anode plate 34. A side wall 811 is provide around an outer periphery of the lower farther inner tank wall 81 in correspondence with an inner side of the upper inner tank side wall 31. The lower farther inner tank wall 81 is vertically moved by vertically moving the anode 33, and when the anode 33 is lifted, the lower farther inner tank wall 81 is also lifted, and an upper surface 812 of the side wall 811 of the lower farther inner tank wall 81 abuts against an inner side of a lower surface 311 of the upper inner tank side wall 31. A farther inner tank 50 is constituted in the inner tank 30 by the cathode 24, the insulator 23, the anode 33, the upper inner tank side wall 31 and the lower farther inner tank side wall 81 in this manner, and a farther inner tank space 501 is defined in the farther inner tank 50. Further, a discharge tank space 51 is defined between the anode plate 34 and the inner tank body 32 by the anode plate 34, the lower farther inner tank wall 81, the upper inner tank side wall 31 and the inner tank body 32.

By abutting the side wall 811 of the lower farther inner tank wall 81 against the lower surface 311 of the upper inner tank side wall 31 in this manner, it is possible to precisely position the anode 33 in the vertical direction, and the precision of parallelism of the anode 33 with respect to the cathode 24 is enhanced. Further, since the resistance heating type heater wire (not shown) is embedded in the anode plate 34, it is possible to heat an inner wall of the farther inner tank 50 including the inner wall and the like of the upper inner tank side wall 31, and an inner wall of the inner tank 30 including the inner wall and the like of the inner tank body 32 by heat transfer using this heater as a heat source. As a result, the farther inner tank 50 and the inner tank 30 can be maintained in a hot wall state, and therefore reaction by-product which is prone to be peeled do not be generated on the inner wall of the farther inner tank 50 and the inner wall of the inner tank 30 and thus, and it is possible to prevent particle from being generated.

Inner discharge ports 342 are formed in the lower farther inner tank wall 81 at predetermined distances from one another over the entire circumferences of outer periphery of the susceptor 35 and the anode plate 34. The farther inner tank space 51 is in communication with the discharge tank space 51 through the inner discharge port 342.

The anode plate 34 is fixed on an upper end of the lower electrode driving shaft 41, and is vertically moved by vertically moving the lower electrode driving shaft 41. Since the lower electrode driving shaft 41 can be driven independently from the inner tank driving shafts 42 and 43, in a state in which the lower inner tank side wall 321 is lifted and abutted against the upper inner side wall 31 to close the inner tank 30, when the anode 33 is vertically moved by the lower electrode driving shaft 41, a distance between an upper surface of the susceptor 35 and a lower surface of the shower plate 26, i.e., a distance L between the electrodes can be set arbitrarily. In the present embodiment, the distance L between the electrodes becomes minimum in a state in which the upper surface 812 of the side wall 811 of the lower farther inner tank wall 81 abuts against the lower surface 311 of the upper inner tank side wall 31. At that time, the closed farther inner tank 50 is formed.

Since other structure is the same as that of the first embodiment, its explanation will be omitted.

When a film is formed or gas etching is carried out, the inner tank 30 is evacuated through the outer discharge tubes 214, the inner discharge tubes 324 and the inner discharge ports 323, and the outer tank space 40 is evacuated through the outer discharge tubes 214. While evacuating the inner tank 30 and the outer tank space 40 in this manner, reaction gas for forming a film or reaction gas for gas etching is introduced from the reaction gas introducing tube 28 into the inner tank 30 to respectively control pressure values of the inner tank 30 and the outer tank space 40 to be predetermined ones.

Next, the operation of the plasma-enhanced CVD apparatus 3 having the above-described structure will be explained.

When a substrate 36 is transferred in, the inner tank driving shafts 42 and 43 are driven, and the inner tank body 32 is lowered to open the inner tank 30. The lower electrode driving shaft 41 is driven to lower the anode 33. The outer tank (vacuum container) 20 is evacuated into a predetermined vacuum through the outer discharge tubes 214.

The gate valve 47 is opened, the substrate 36 is transferred into the outer tank (vacuum container) 20 from the substrate IN/OUT opening 48 by a transfer device (not shown), and the substrate 36 is placed on the susceptor 35. After the transfer device is retreated out of the outer tank (vacuum container) 20, the gate valve 47 is closed. Then, the anode 33 is lifted by the lower electrode driving shaft 41, the upper surface 812 of the side wall 811 of the lower farther inner tank wall 81 is abutted against the lower surface 311 of the upper inner tank side wall 31 to form the closed farther inner tank 50, the inner tank body 32 is lifted by the inner tank driving shafts 42 and 43, and the lower inner tank side wall 321 is abutted against the upper inner tank side wall 31 to close the inner tank 30.

Thereafter, reaction gas for forming a film is introduced from the reaction gas introducing tube 28 into the farther inner tank 50 while evacuating the farther inner tank 50, the inner tank 30 and the outer tank space 40 to respectively control pressure values of the farther inner tank 50, the inner tank 30 and the outer tank space 40 to be the predetermined ones, and an RF power is applied between the cathode 24 and the anode 33 by the RF power source 46 to generate plasma while heating by the resistance heating type heater wire (not shown) embedded in the anode plate 34, thereby forming a film on the substrate 36 by the plasma-enhanced CVD method. At the time of film formation, reaction gas and reaction by-product are discharged through the inner discharge ports 324, the discharge tank space 51, the inner discharge ports 323, the inner discharge tubes 324 and the outer discharge tubes 214.

When the film formation is completed, supply of reaction gas is stopped, the farther inner tank 50, the inner tank 30 and the outer tank space 40 are evacuated through the inner discharge ports 324, the discharge tank space 51, the inner discharge ports 323, the inner discharge tubes 324, the outer discharge tubes 214 and the like.

Thereafter, the inner tank body 32 is lowered, the anode 33 is also lowered and then, the gate valve 47 is opened, and the substrate 36 is transferred out from the substrate IN/OUT opening 48 by the transfer device (not shown).

Then, another substrate 36 is transferred in from the substrate IN/OUT opening 48 by the transfer device (not shown), and film forming process onto the substrate 36 is carried out. After the film forming processes onto the substrate 36 in this manner are carried out predetermined times, gas cleaning is carried out.

To carry out the gas cleaning, the anode 33 is lifted by the lower electrode driving shaft 41 in a state in which the substrate 36 is not placed on the susceptor 35, the distance between the upper surface of the susceptor 35 and the lower surface of the shower plate 26, i.e., the distance L between the electrodes is set to a value suitable for the gas cleaning. The distance L between the electrodes suitable for the gas cleaning is set to be greater than that suitable for the plasma-enhanced CVD film formation. In this case, the upper surface 812 of the side wall 811 of the lower farther inner tank wall 81 is not abutted against the lower surface 311 of the upper inner tank side wall 31, and the farther inner tank 50 is not closed. The inner tank body is lifted by the inner tank driving shafts 42 and 43, and the lower inner tank side wall 321 is abutted against the upper inner tank side wall 31 to close the inner tank 30.

Thereafter, reaction gas for the gas cleaning is introduced from the reaction gas introducing tube 28 into the inner tank 30 while evacuating the inner tank 30 and the outer tank space 40 to respectively control pressure values of the inner tank 30 and the outer tank space 40 to be the predetermined ones, and an RF power is applied between the cathode 24 and the anode 33 to generate plasma, thereby removing reaction by-product adhered to or accumulated on an inner wall of the inner tank 30 by etching. At the time of gas cleaning, residue generated during the cleaning is discharged through the inner discharge ports 323, the inner discharge tubes 324 and the outer discharge tubes 214.

When the gas cleaning is completed, supply of cleaning gas is stopped, the inner tank 30 and the outer tank space 40 are evacuated through the inner discharge tubes 324, the outer discharge tubes 214 and the like.

Thereafter, the film forming process onto the substrate 36 is again carried out as in the above-described manner.

As described above, in the present embodiment, since the distance L between the electrodes can be changed into values respectively suitable for the plasma-enhanced CVD film formation and the gas cleaning, it is possible to enhance the processing efficiency of both the plasma-enhanced CVD film formation and the gas cleaning.

Further, since both the plasma-enhanced CVD film formation and the gas cleaning are carried out in a state in which the lower inner tank side wall 321 is abutted against the upper inner tank side wall 31 and the inner tank 30 is closed, it is possible to limit the place where plasma is generated during the film formation or the gas cleaning only to the inside of the inner tank 30. As a result, it is possible to increase plasma density, and to carry out the film formation or the gas etching efficiently. Further, since gas and the like for the film formation or the gas etching process do not leak to the outer tank space 40, it is possible to prevent the inside of the outer tank 20 from being contaminated.

In the present embodiment, the lower farther inner tank wall 81 is fixed to the periphery of the anode plate 34, and the upper surface 812 of the side wall 811 of the lower farther inner tank wall 81 is abutted against the lower surface 311 of the upper inner tank side wall 31 to form the farther inner tank 50 in the inner tank 30. As a result, it is possible to limit the place where plasma is generated during the film formation and the like to the inside of the farther inner tank 50 which is narrower than the inner tank 30. Therefore, it is possible to further increase plasma density, and to carry out the film formation or the gas etching more efficiently.

Further, the precision of parallelism of the anode 33 with respect to the cathode 24 is enhanced by bringing the side wall 811 of the lower farther inner tank wall 81 into abutment against the lower surface 311 of the upper inner tank side wall 31, and since the farther inner tank 50 and the inner tank 30 can be maintained in hot a wall state, it is possible to prevent particles from being generated.

(Fourth Embodiment)

Figure 4:
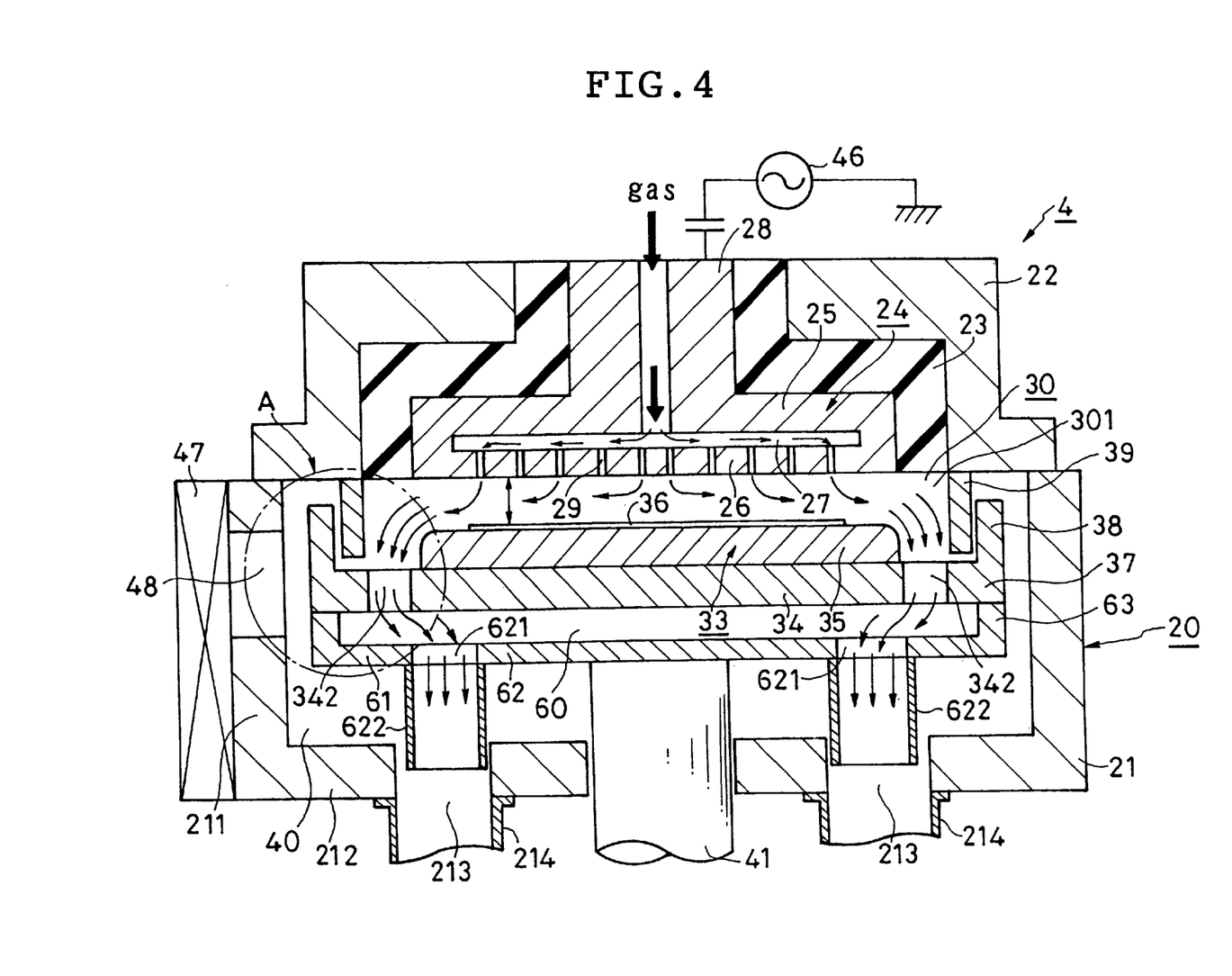
FIG. 4 is a longitudinal sectional view for explaining a plasma processing apparatus and a plasma processing method according to a fourth embodiment of the present invention.

Referring to FIG. 4, in the fourth embodiment, an upper inner tank side wall 39 surrounding an insulator 23 is fixed to a lower surface of a ceiling lid 22, and this upper inner tank side wall 39 is longer in the longitudinal direction than that of the first embodiment.

A lower electrode (anode) 33 is provided in an outer tank 20 such as to be opposed to a cathode 24. The anode 33 includes an anode plate 34 and a susceptor 35 provided on the anode plate 34. A resistance heating type heater wire (not shown) is embedded in the anode plate 34.

A lower inner tank wall 37 is fixed to a periphery of the anode plate 34. A side wall 38 is provided around an outer periphery of the lower inner tank wall 37 such that the side wall 38 is located at an outer side of the upper inner tank side wall 39.

A gas collection tank 61 is provided below the anode plate 34, and an upper portion of a side wall 63 of the gas collection tank 61 is fixed to a lower portion of the lower inner tank wall 37. A gas collection tank space 60 is defined by the anode plate 34, the lower inner tank wall 37 and the gas collection tank 61.

Inner discharge ports 342 are formed in the lower inner tank wall 37 at predetermined distances from one another over the entire circumferences of outer periphery of the susceptor 35 and the anode plate 34.

Discharge ports 621 are formed in a bottom plate 62 of the gas collection tank 61, and discharge tubes 622 which are in communication with discharge ports 621 are mounted to the bottom plate 62. Each of the discharge tubes 622 is inserted into an outer discharge port 213 and an outer discharge tube 214. An outer tank space 40 is defined by an outer tank body 21, the ceiling lid 22, the upper inner tank side wall 39, the lower inner tank wall 37, the gas collection tank 61, a lower electrode driving shaft 41 and the discharge tubes 622.

The bottom plate 62 of the gas collection tank 61 is fixed to an upper end of the lower electrode driving shaft 41, and is vertically moved by vertically moving the lower electrode driving shaft 41. The lower electrode driving shaft 41 is air-tightly inserted through a bottom plate 212 of the outer tank body 21 for vertical movement.

The side wall 38 of the lower inner tank wall 37 is lifted by lifting the lower electrode driving shaft 41 so that the side wall 38 of the lower inner tank wall 37 and the upper inner tank side wall 39 are superposed on each other. However, a predetermined distance G is provided between the side wall 38 of the lower inner tank wall 37 and the upper inner tank side wall 39.

When the side wall 38 of the lower inner tank wall 37 and the upper inner tank side wall 39 are superposed on each other, the inner tank 30 is formed by the cathode 24, the insulator 23, the anode 33, the upper inner tank side wall 39 and the lower inner tank wall 37, and an inner tank space 301 is defined in the inner tank 30. The inner tank space 301 is in communication with the gas collection tank space 60 through the inner discharge ports 342.

By lifting the lower electrode driving shaft 41, the side wall 38 of the lower inner tank wall 37 is lifted, and the side wall 38 of the lower inner tank wall 37 and the upper inner tank side wall 39 are superposed on each other to close the inner tank 30. With this structure, it is possible to confine plasma into the inner tank 30.

By lifting the lower electrode driving shaft 41, the anode 33 is also lifted together with the side wall 38 of the lower inner tank wall 37. Therefore, when the lower electrode driving shaft 41 is further lifted after that, the side wall 38 of the lower inner tank wall 37 and the upper inner tank side wall 39 are superposed on each other with the inner tank 30 closed and in this state, the anode 33 is lifted, the distance between the upper surface of the susceptor 35 and the lower surface of the shower plate 26, i.e., the distance L between the electrodes can be shortened.

In the present embodiment, the side wall 38 of the lower inner tank wall 37 and the upper inner tank side wall 39 are not contacted with each other. Therefore, if a hoisting and lowering mechanism using an AC servo-motor or the like as a driving source is provided on the lower electrode driving shaft 41, it is possible to arbitrarily change the distance L between the electrodes while keeping the closed state of the inner tank 30.

When a film is formed or gas etching is carried out, gas in the inner tank 30 is discharged through the outer discharge tubes 214, the discharge ports 621, the gas collection space 60 and inner discharge tubes 324, and gas in the outer tank space 40 is discharged through the outer discharge tubes 214. While evacuating the inner tank 30 and the outer tank space 40 in this manner, reaction gas for forming a film or reaction gas for gas etching is introduced into the inner tank 30 to respectively control pressure values of the inner tank 30 and the outer tank space 40 to be predetermined ones.

Figure 5A:
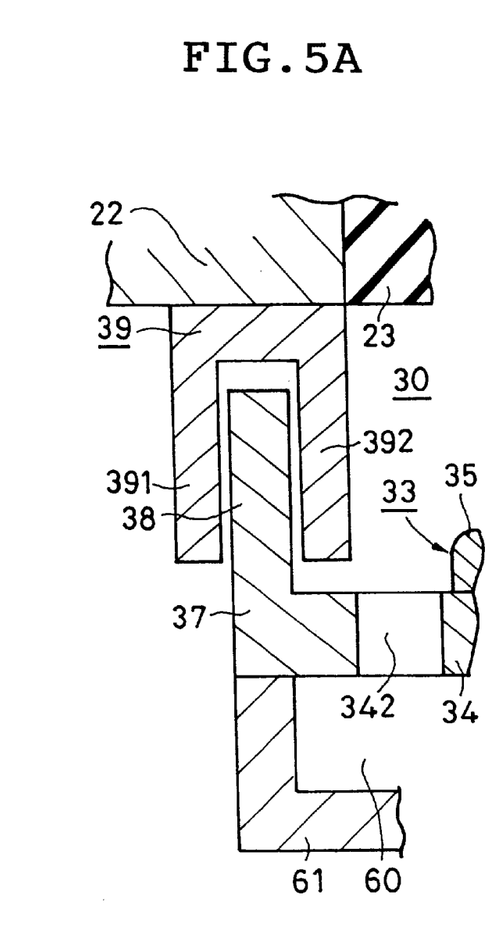
FIGS. 5A–5C are partially enlarged longitudinal sectional views for explaining plasma processing apparatuses and plasma processing methods according to the fourth embodiment of the present invention.
Figure 5B:
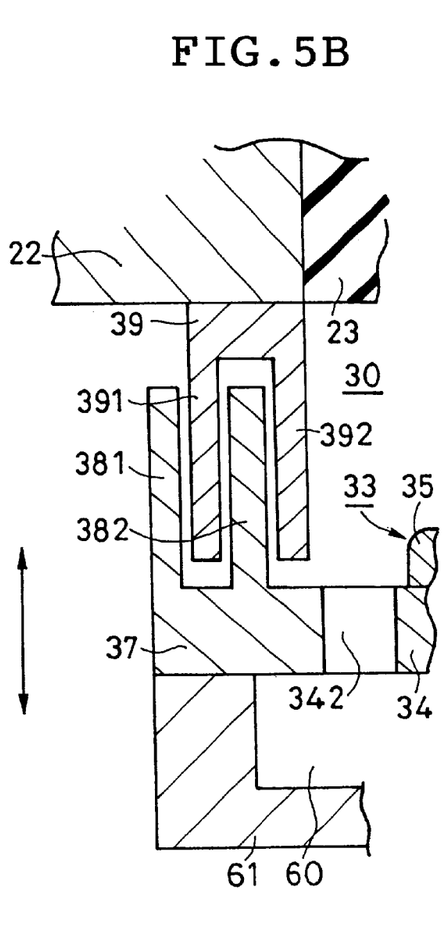
Figure 5C:
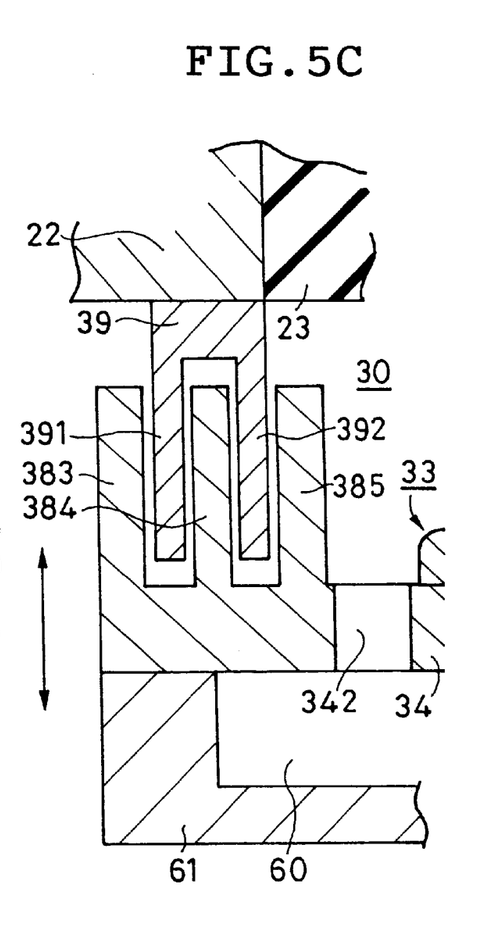

Further, as shown in FIGS. 5(A) to 5A(C), when a plurality of superposing portions between the side wall 38 of the lower inner tank wall 37 and the upper inner tank side wall 39 are provided, gas sealing ability of the inner tank 30 is enhanced, and it is possible to confile plasma into the inner tank 30 more reliably.

In order to provide the plurality of superposing portions between the side wall 38 of the lower inner tank wall 37 and the upper inner tank side wall 39, for example, it is preferable to employ: a structure shown in FIG. 5(A) in which the upper inner tank side wall 39 is formed into two auxiliary side walls 391 and 392 to sandwich the side wall 38 of the lower inner tank wall 37 between the auxiliary side walls 391 and 392; a structure shown in FIG. 5(B) in which the upper inner tank side wall 39 is formed into two auxiliary side walls 391 and 392, the lower inner tank side wall 38 is also formed into two auxiliary side walls 381 and 382, and these auxiliary side walls 391, 392 and auxiliary side walls 381, 382 are alternately superposed on one another, and a structure shown in FIG. 5(C) in which the upper inner tank side wall 39 is formed into two auxiliary side walls 391 and 392, the lower inner tank side wall 38 is formed into three auxiliary side walls 383 to 385, and these auxiliary side walls 391, 392 and auxiliary side walls 383 to 385 are alternately superposed on one another.

Since other structure is the same as that of the first embodiment, its explanation will be omitted.

Next, the operation of the plasma-enhanced CVD apparatus 4 having the above-described structure will be explained.

When a substrate 36 is transferred in, the lower electrode driving shaft 41 is driven to lower the anode 33 and the lower inner tank wall 37, thereby opening the inner tank 30. The outer tank (vacuum container) 20 is evacuated into a predetermined vacuum through the outer discharge tubes 214.

The gate valve 47 is opened, the substrate 36 is transferred into the outer tank (vacuum container) 20 from the substrate IN/OUT opening 48 by a transfer device (not shown), and the substrate 36 is placed on the susceptor 35. After the transfer device is retreated out of the outer tank (vacuum container) 20, the gate valve 47 is closed. Then, the anode 33 and the lower inner tank wall 37 are lifted by the lower electrode driving shaft 41, and the side wall 38 of the lower inner tank wall 37 and the upper inner tank side wall 39 are superposed on each other to close the inner tank 30. Thereafter, the anode 33 and the lower inner tank wall 37 are further lifted by the lower electrode driving shaft 41, and the distance L between the electrodes is set to a value suitable for film formation while keeping the closed state of the inner tank 30.

Thereafter, reaction gas for forming a film is introduced from the reaction gas introducing tube 28 into the inner tank 30 while evacuating the inner tank 30 and the outer tank space 40 to respectively control pressure values of the inner tank 30 and the outer tank space 40 to be the predetermined ones, and an RF power is applied between the cathode 24 and the anode 33 by the RF power source 46 to generate plasma while heating by the resistance heating type heater wire (not shown) embedded in the anode plate 34, thereby forming a film on the substrate 36 by the plasma-enhanced CVD method. At the time of film formation, reaction gas and reaction by-product are discharged through the inner discharge ports 342, the gas collection tank space 60, the discharge ports 621, the discharge tubes 622 and the outer discharge tubes 214.

When the film formation is completed, supply of reaction gas is stopped, the inner tank 30 and the outer tank space 40 are evacuated through the inner discharge ports 342, the gas collection tank space 60, the discharge ports 621, the discharge tubes 622, the outer discharge tubes 214 and the like.

Thereafter, the anode 33 and the lower inner tank wall 37 are lowered and then, the gate valve 47 is opened, and the substrate 36 is transferred out from the substrate IN/OUT opening 48 by the transfer device (not shown).

Then, another substrate 36 is transferred in from the substrate IN/OUT opening 48 by the transfer device (not shown), and film forming process onto the substrate 36 is carried out. After the film forming processes onto the substrate 36 in this manner are carried out predetermined times, gas cleaning is carried out.

To carry out the gas cleaning, the anode 33 and the lower inner tank wall 37 are lifted by the lower electrode driving shaft 41 in a state in which the substrate 36 is not placed on the susceptor 35, the side wall 38 of the lower inner tank wall 37 and the upper inner tank side wall 39 are superposed on each other to close the inner tank 30. Thereafter, the anode 33 and the lower inner tank wall 37 are further lifted by the lower electrode driving shaft 41, and the distance L between the electrodes is set to a value suitable for gas cleaning while keeping the closed state of the inner tank 30. The distance L between the electrodes suitable for the gas cleaning is set to be greater than that suitable for the plasma-enhanced CVD film formation.

Thereafter, reaction gas for forming a film is introduced from the reaction gas introducing tube 28 into the inner tank 30 while evacuating the inner tank 30 and the outer tank space 40 to respectively control pressure values of the inner tank 30 and the outer tank space 40 to be the predetermined ones, and an RF power is applied between the cathode 24 and the anode 33 to generate plasma, thereby removing reaction by-product adhered to or accumulated on an inner wall of the inner tank 30 by etching. At the time of gas cleaning, residue generated during the cleaning is discharged through the inner discharge ports 342, the gas collection tank space 60, the discharge ports 621, the discharge tubes 622, the outer discharge tubes 214 and the like.

When the gas cleaning is completed, supply of cleaning gas is stopped, the inner tank 30 and the outer tank space 40 are evacuated through the inner discharge tubes 324, the gas collection space 60, the outer discharge tubes 214 and the like.

Thereafter, the film forming process onto the substrate 36 is again carried out as in the above-described manner.

As described above, in the present embodiment, since the distance L between the electrodes can be changed into values respectively suitable for the plasma-enhanced CVD film formation and the gas cleaning, it is possible to enhance the processing efficiency of both the plasma-enhanced CVD film formation and the gas cleaning.

Further, since both the plasma-enhanced CVD film formation and the gas cleaning are carried out in a state in which the side wall 38 of the lower inner tank wall 37 and the upper inner tank side wall 39 are superposed on each other and the inner tank 30 is closed, it is possible to limit the place where plasma is generated during the film formation and the gas cleaning only to the inside of the inner tank 30. As a result, it is possible to increase plasma density, and to carry out the film formation and the gas etching efficiently. Further, since gas and the like for the film formation and the gas etching process do not leak to the outer tank space 40, it is possible to prevent the inside of the outer tank 20 from being contaminated.

As described above, according to the plasma-enhanced CVD apparatus having the online gas cleaning function of the present invention, there are merits that it is possible to select the distance between the electrodes suitable for two difference processes, i.e., the film forming process and the cleaning process, and the processing ability of the apparatus can be enhanced.

A work is processed by film forming process. By the film forming process, film and reaction by-product are adhered to a wall surface of the electrode, and the adhering amount of the film and reaction by-product is increased, they float in the space and are accumulated on the work. This brings about defective products. The cleaning process is carried out for removing the film and reaction by-product of the wall surface of the electrode before they bring about the defective products. Therefore, as the interval between the cleaning processes is longer, and as one processing time thereof is shorter, the ability of the apparatus can be enhanced. According to the third embodiment, it is possible to heat the inner wall surface of the inner tank 30, the adhering force of the film can be enhanced, the interval between the cleaning processes can be made longer by suppressing the reaction by-product which has weak adhering force and which is prone to float in the space. Therefore, there is a merit that the processing time can be shortened.

The present invention has merits that the closed structure can always be secured and the outer tank can be prevented from being contaminated.

As a substrate used for the plasma-enhanced CVD apparatus of the present invention, a semiconductor wafer, a glass substrate for a liquid crystal display and the like are preferably used.

Although the distance between the electrodes is changed between the plasma-enhanced CVD film formation and the gas cleaning in each of the above embodiments, even when different kinds of film formation are carried out by the same apparatus, it is possible to change the distance between the electrodes in accordance with different kinds of film formation.

According to the present invention, it is possible to change the distance between the opposed electrodes in accordance with the kinds of processes, and the processing efficiency of each of the processes can be enhanced independently. Even if the distance between the electrodes is changed, plasma density in the inner tank is not lowered when Plasma process, e.g., is carried out, and gas and the like do not leak to the outer tank. Therefore, the processing efficiency is not lowered, and the outer tank can be prevented from being contaminated.

What is claimed is:

1. A substrate processing apparatus, comprising:

an outer tank, an inner tank provided in said outer tank, and opposed electrodes provided in said inner tank, wherein
      a distance between said opposed electrodes can be changed in a state in which said inner tank can completely confine plasma therein, and
      said inner tank comprises first and second inner tank constituent members, and said state in which said inner tank can completely confine plasma therein is established by superposing a side wall of said second inner tank constituent member on a side wall of said first inner tank constituent member.

2. A substrate processing apparatus according to claim 1, wherein said opposed electrodes comprise first and second electrodes which are opposed to each other, said first electrode is disposed closer to said first inner tank constituent member, said second electrode is disposed closer to said second inner tank constituent member, and said second electrode can move in a state in which said side wall of said second inner tank constituent member is superposed on said side wall of said first inner tank constituent member.

3. A substrate processing apparatus according to claim 2, wherein a least one of said side wall of said first inner tank constituent member and said side wall of said second inner tank constituent member comprises a plurality of auxiliary side walls, and said state in which said side wall of said second inner tank constituent member is superposed on said side wall of said first inner tank constituent member is a state in which said plurality of auxiliary side walls of one of said side wall of said first inner tank constituent member and said side wall of said second inner tank constituent member, and said side wall of the other of said first inner tank constituent member and said side wall of said second inner tank constituent member are superposed on each other.

4. A substrate processing apparatus according to claim 1, further comprising an exhaust located under lower one of the opposed electrodes, thereby a gas after substrate processing flows into under the lower one of the opposed electrodes.

5. A substrate processing apparatus, comprising:

an outer tank, an inner tank provided in said outer tank, and opposed electrodes provided in said inner tank, wherein
      said inner tank can completely confine plasma therein with respect to two or more different distances between said opposed electrodes, and
      said inner tank comprises first and second inner tank constituent members, and said state in which said inner tank can completely confine plasma therein is established by superposing a side wall of said second inner tank constituent member on a side wall of said first inner tank constituent member.

6. A substrate processing apparatus according to claim 5, wherein said opposed electrodes comprise first and second electrodes which are opposed to each other, said first electrode is disposed closer to said first inner tank constituent member, said second electrode is disposed closer to said second inner tank constituent member, and said side wall of said second inner tank constituent member can be superposed on said side wall of said first inner tank constituent member with respect to two or more different positions of said second electrode.

7. A substrate processing apparatus, comprising:

an outer tank, an inner tank provided in said outer tank, and opposed electrodes provided in said inner tank, wherein
      a distance between said opposed electrodes can be changed in a state in which said inner tank is closed,
      said inner tank comprises first and second inner constituent members, and said inner tank is closed by superposing a side wall of said second inner tank constituent member on a side wall of said first inner tank constituent member,
      at least one of said side wall of said first inner tank constituent member and said side wall of said second inner tank constituent member comprises a plurality of auxiliary side walls, and
      said plurality of auxiliary side walls of one of said side wall of said first inner tank constituent member and said side wall of said second inner tank constituent member, and said side wall of the other of said first inner tank constituent member and said side wall of said second inner tank constituent member are superposed on each other, thereby closing said inner tank.

8. A substrate processing apparatus, comprising:

an outer tank, an inner tank provided in said outer tank, and opposed electrodes provided in said inner tank wherein
      said inner tank can be closed with respect to two or more different distances between said opposed electrodes,
      said inner tank comprises first and second inner constituent members, and said inner tank is closed by superposing a side wall of said second inner tank constituent member on a side wall of said first inner tank constituent member,
      at least one of said side wall of said first inner tank constituent member and said side wall of said second inner tank constituent member comprises a plurality of auxiliary side walls, and
      said plurality of auxiliary side walls of one of said side wall of said first inner tank constituent member and said side wall of said second inner tank constituent member, and said side wall of the other of said first inner tank constituent member and said side wall of said second inner tank constituent member are superposed on each other, thereby closing said inner tank.

9. A substrate processing apparatus, comprising:

an outer tank, an inner tank provided in said outer tank, and opposed electrodes provided in said inner tank, wherein
a distance between said opposed electrodes can be changed in a state in which said inner tank can confine plasma therein,
said inner tank comprises first and second inner tank constituent members,
said state in which said inner tank can confine plasma therein is established by bringing said second inner tank constituent member into contact with said first inner tank constituent member,
said opposed electrodes comprise first and second electrodes which are opposed to each other,
said first electrode is disposed closer to said first inner tank constituent member,
said second electrode is disposed closer to said second inner tank constituent member,
said second electrode can move in a state in which said second inner tank constituent member is in contact with said first inner tank constituent member,
said substrate processing apparatus further comprises a further inner tank constituent member coupled to said second electrode, and
a further inner tank can be formed in said inner tank by bringing said further inner tank constituent member into abutment against said first inner tank constituent member.

10. A substrate processing apparatus according to claim 9, further comprising a heater provided in or coupled to said second electrode.

11. A substrate processing apparatus according to claim 9, wherein said further inner tank constituent member is provided around said second electrode.

12. A substrate processing apparatus, comprising:

an outer tank, an inner tank provided in said outer tank, and opposed electrodes provided in said inner tank, wherein
said inner tank can confine plasma therein with respect to two or more different distances between said opposed electrodes,
said inner tank comprises first and second inner tank constituent members,
said state in which said inner tank can confine plasma therein is established by bringing said second inner tank constituent member into contact with said first inner tank constituent member,
said opposed electrodes comprise first and second electrodes which are opposed to each other,
said first electrode is disposed closer to said first inner tank constituent member,
said second electrode is disposed closer to said second inner tank constituent member,
said second inner tank constituent member can contact said first inner tank constituent member with respect to two or more different distances between said opposed electrodes,
said substrate processing apparatus further comprises a further inner tank constituent member coupled to said second electrode, and a further inner tank can be formed in said inner tank by bringing said further inner tank constituent member into abutment against said first inner tank constituent member.

13. A substrate processing apparatus comprising:

an outer tank, an inner tank provided in said outer tank, and opposed electrodes provided in said inner tank, wherein
a distance between said opposed electrodes can be changed in a state in which said inner tank is closed, and
said inner tank comprises first and second inner tank constituent members, and said state in which said inner tank is closed is established by superposing a side wall of said second inner tank constituent member on a side wall of said first inner tank constituent member.

14. A substrate processing apparatus according to claim 13, wherein said opposed electrodes comprise first and second electrodes which are opposed to each other,
said first electrode is disposed closer to said first inner tank constituent member,
said second electrode is disposed closer to said second inner tank constituent member, and
said second electrode can move in a state in which said side wall of said second inner tank constituent member is superposed on said side wall of said first inner tank constituent member.

15. A substrate processing apparatus according to claim 14, wherein at least one of said side wall of said first inner tank constituent member and said side wall of said second inner tank constituent member comprises a plurality of auxiliary side walls, and
said state in which said side wall of said second inner tank constituent member is superposed on said side wall of said first inner tank constituent member is a state in which said plurality of auxiliary side walls of one of said side wall of said first inner tank constituent member and said side wall of said second inner tank constituent member, and said side wall of the other of said first inner tank constituent member and said side wall of said second inner tank constituent member are superposed on each other.

16. A substrate processing apparatus according to claim 13, further comprising an exhaust located under lower one of the opposed electrodes, thereby a gas after substrate processing flows into under the lower one of the opposed electrodes.

17. A substrate processing apparatus comprising:

an outer tank, an inner tank provided in said outer tank, and opposed electrodes provided in said inner tank, wherein
said inner tank can be closed with respect to two or more different distances between said opposed electrodes, and
said inner tank comprises first and second inner tank constituent members, and said state in which said inner tank is closed is established by superposing a side wall of said second inner tank constituent member on a side wall of said first inner tank constituent member.

18. A substrate processing apparatus according to claim 17, wherein said opposed electrodes comprise first and second electrodes which are opposed to each other,
said first electrode is disposed closer to said first inner tank constituent member,
said second electrode is disposed closer to said second inner tank constituent member, and said side wall of said second inner tank constituent member can be superposed on said side wall of said first inner tank constituent member with respect to two or more different positions of said second electrode.

19. A substrate processing apparatus according to claim 18, wherein at least one of said side wall of said first inner tank constituent member and said side wall of said second inner tank constituent member comprises a plurality of auxiliary side walls, and said state in which said side wall of said second inner tank constituent member is superposed on said side wall of said first inner tank constituent member is a state in which said plurality of auxiliary side walls of one of said side wall of said first inner tank constituent member and said side wall of said second inner tank constituent member, and said side wall of the other of said first inner tank constituent member and said side wall of said second inner tank constituent member are superposed on each other.

20. A substrate processing apparatus according to claim 17, further comprising an exhaust located under lower one of the opposed electrodes, thereby a gas after substrate processing flows into under the lower one of the opposed electrodes.

* * * * *